(12) United States Patent
Huang et al.

(10) Patent No.: US 9,455,705 B2
(45) Date of Patent: Sep. 27, 2016

(54) TOUCH INDUCTIVE UNIT AND TOUCH PANEL

(71) Applicant: WINTEK CORPORATION, Taichung (TW)

(72) Inventors: Chi-Ming Huang, Taichung (TW);
Shyh-Jeng Chen, Taichung (TW);
Pei-Fang Tsai, Taichung (TW);
Ming-Chuan Lin, Taichung (TW);
Hsueh-Chih Wu, Taichung (TW);
Wen-Hung Wang, Taichung (TW);
Wen-Yi Wang, Taichung (TW)

(73) Assignee: WINTEK CORPORATION, Taichung (TW)

( * ) Notice: Subject to any disclaimer, the term of this patent is extended or adjusted under 35 U.S.C. 154(b) by 306 days.

(21) Appl. No.: 14/274,786

(22) Filed: May 12, 2014

(65) Prior Publication Data
US 2014/0332361 A1 Nov. 13, 2014

(30) Foreign Application Priority Data
May 10, 2013 (TW) .............................. 102116645 A (51) Int. Cl.
*H03K 17/96* (2006.01)

(52) U.S. Cl.
CPC ........ *H03K 17/9622* (2013.01); *H03K 17/962* (2013.01); *H03K 2017/9613* (2013.01); *H03K 2217/96038* (2013.01); *H03K 2217/960775* (2013.01)

(58) Field of Classification Search
CPC ........... H03K 2017/9613; H03K 2217/96038; H03K 17/962; H03K 17/9622
See application file for complete search history.

(56) References Cited

U.S. PATENT DOCUMENTS

| | | | |
|---|---|---|---|
| 2012/0169626 A1* | 7/2012 | Hsieh ...................... | G06F 3/044 345/173 |
| 2014/0028627 A1* | 1/2014 | Nakagawa ............ | G06F 3/0416 345/174 |
| 2015/0001060 A1* | 1/2015 | Kim ........................ | G06F 3/044 200/600 |
| 2015/0041303 A1* | 2/2015 | Cao ......................... | G06F 3/044 200/600 |

* cited by examiner

*Primary Examiner* — Abbas Abdulselam
(74) *Attorney, Agent, or Firm* — Ming Chow; Sinorica, LLC (57) ABSTRACT

A touch inductive unit includes a receiving electrode pattern and a driving electrode pattern. The receiving electrode pattern includes a first main stem, a first branch portion and a second branch portion. The first branch portion and the second branch portion are extended from the first main stem. The driving electrode pattern includes a second main stem, a third branch portion and a fourth branch portion. The third branch portion and the fourth branch portion are extended from the second main stem. The receiving electrode pattern and the driving electrode pattern are interdigitated and physically spaced apart from each other.

25 Claims, 6 Drawing Sheets

TOUCH INDUCTIVE UNIT AND TOUCH PANEL

BACKGROUND OF THE INVENTION

1. Field of the Invention

The present disclosure relates to a touch inductive unit and a touch panel having the same, and more particularly, to a mutual capacitance touch inductive unit and a touch panel having the same.

2. Description of the Prior Art

Along with the development of the touch sensing technique, the commercially available touch panels are extensively used for various sizes or products such as mobile phone, GPS navigator system, tablet PC, PDA, and laptop PC, owing to their convenience and practicality.

Figure 1:
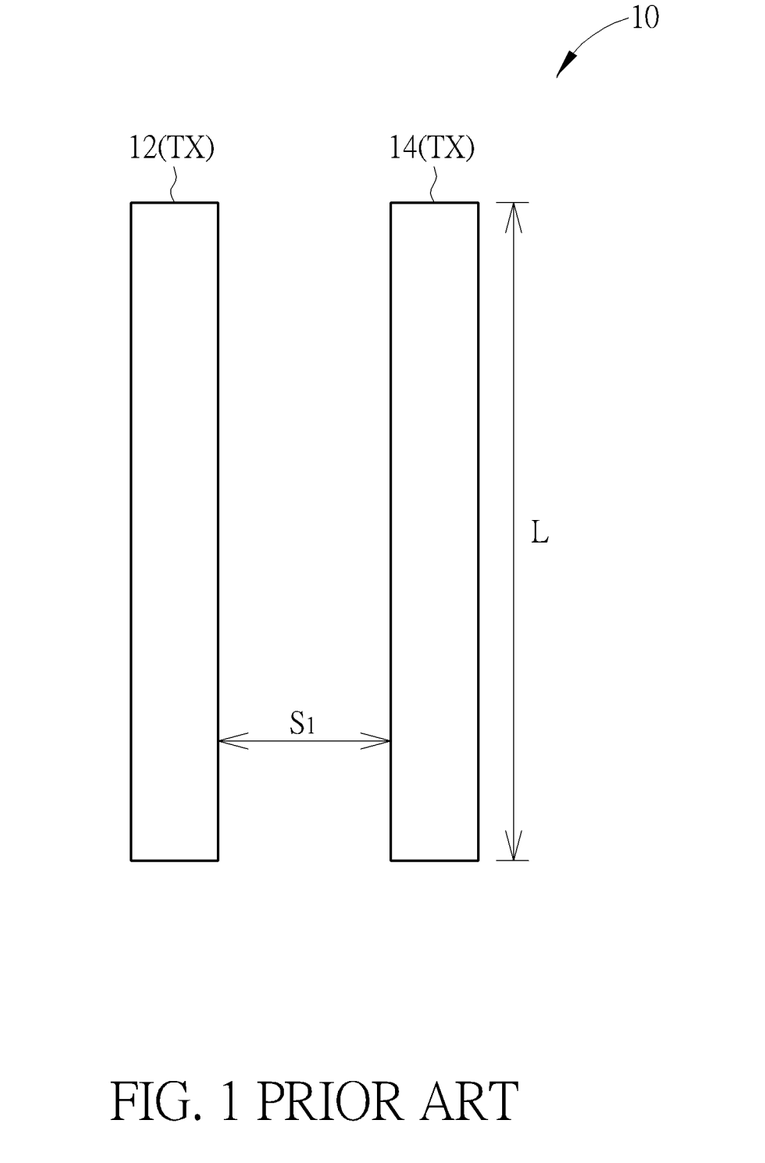
FIG. 1 is a schematic drawing of a top view of a mutual capacitance touch sensing device.
Figure 2:
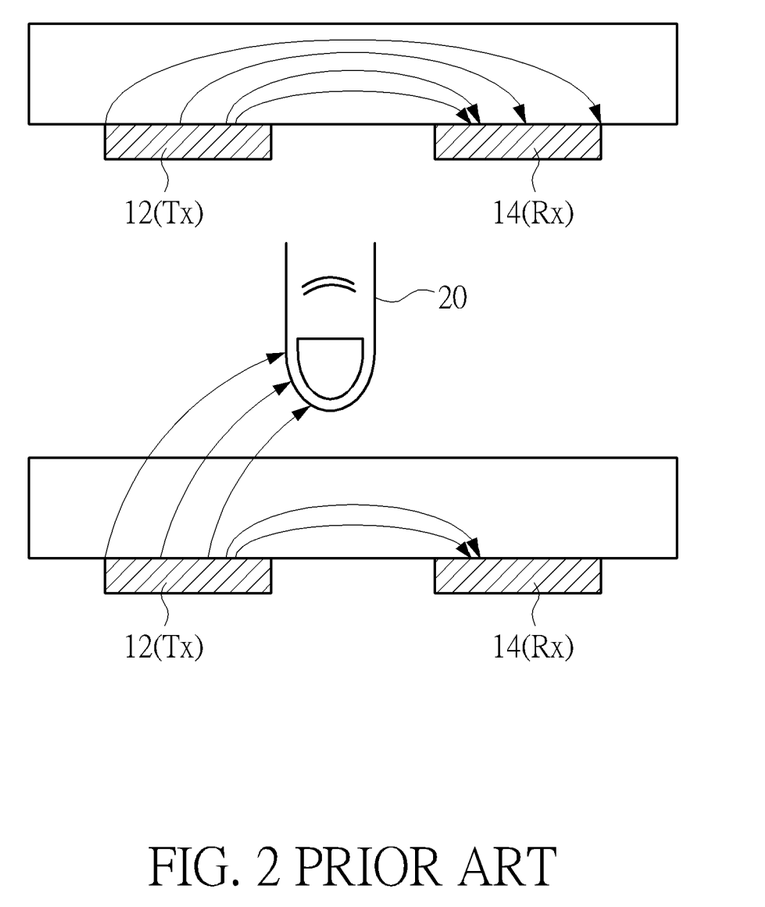
FIG. 2 is a schematic drawing illustrating the mutual capacitance touch sensing device before and after touch.

The touch panels are categorized according to different sensing principles, and the capacitive touch panels draw attentions due to its multi touch function. The capacitive touch panels are classified into two types: the self-capacitance touch panel and the mutual capacitance touch panel. Please refer to FIGS. 1 and 2, wherein FIG. 1 is a schematic drawing of a top view of a mutual capacitance touch panel, and FIG. 2 is a schematic drawing illustrating the touched and untouched operations of mutual capacitance touch panel. As shown in FIG. 1, a sensing device 10 of the mutual capacitance touch panel includes a driving (Tx) electrode 12 and a receiving (Rx) electrode 14 that are formed correspondingly to each other. When a user touches the panel, the mutual capacitance between the Tx 12 and the Rx 14 is changed and thus the touch point is recognized. Accordingly, the touch sensing function is realized. More specific, when a user's finger 20 closes to the mutual capacitance touch sensing device 10, the electric fields between the Tx 12 and the Rx 14 are changed due to the ground capacitance of human body. Therefore, by detecting capacitance variation of the sensing device 10 between touched and untouched operations, a touch point of the user's finger 20 is recognized and identified.

Please refer to FIG. 1 again. It is well-known to those skilled in the art that the fringe capacitance of the sensing device 10 is related to a length L of the Tx electrode 12 and the Rx electrode 14, and a spacing distance $S_1$ between the Tx electrode 12 and the Rx electrode 14. In order to improve sensitivity of the sensing device, it is always in need to modify the length L of the Tx electrode 12 and the Rx electrode 14 and the spacing distance $S_1$.

SUMMARY OF THE INVENTION

In accordance with the foregoing discussion, it is therefore an objective of the present invention to provide a touch inductive unit and a touch panel having the same. The provided touch inductive unit is realized with one layer solution, therefore the receiving electrode patterns and the driving electrode patterns which construct the touch inductive units on the touch panel are coplanar. Because the receiving electrode pattern and the driving electrode pattern of each touch inductive unit are interdigitated and physically spaced apart from each other, sensitivity of the touch inductive unit is improved without increasing panel loading.

According to a preferred embodiment of the present invention, a touch inductive unit is provided. The touch inductive unit includes a receiving electrode pattern and a driving electrode pattern. The receiving electrode pattern includes at least a receiving electrode branch and the driving electrode pattern includes at least a driving electrode branch. More important, the receiving electrode branch and the driving electrode branch are interdigitated and physically spaced apart from each other to generate a fringe capacitance.

According to a preferred embodiment of the present invention, another touch inductive unit is provided. The touch inductive unit includes a receiving electrode pattern and a driving electrode pattern. The receiving electrode pattern includes a first main stem, a first branch portion, and a second branch portion. The first branch portion and the second branch portion are extended from the first main stem. The driving electrode pattern includes a second main stem, a third branch portion, and a fourth branch portion. The third branch portion and the fourth branch portion are extended from the second main stem. It is noteworthy that the receiving electrode pattern and the driving electrode pattern are interdigitated and physically spaced apart from each other.

According to a preferred embodiment of the present invention, a touch panel is provided. The touch panel includes a substrate, a plurality of receiving electrode patterns disposed on the substrate, and a plurality of driving electrode patterns disposed on the substrate. The receiving electrode patterns are electrically isolated from each other, and the driving electrode patterns are respectively corresponding to one receiving electrode pattern. Each of the receiving electrode patterns includes a first main stem, a first branch portion, and a second branch portion. The first branch portion and the second branch portion are extended from the first main stem. Each of the driving electrode patterns includes a second main stem, a third branch portion, and a fourth branch portion. The third branch portion and the fourth branch portion are extended from the second main stem. It is noteworthy that the corresponding receiving electrode pattern and driving electrode pattern are interdigitated and physically spaced apart from each other. And thus a plurality of touch inductive units are formed on the substrate.

These and other objectives of the present invention will no doubt become obvious to those of ordinary skill in the art after reading the following detailed description of the preferred embodiment that is illustrated in the various figures and drawings.

DETAILED DESCRIPTION

A more complete understanding of the present invention will be afforded to those skilled in the art, as well as a realization of additional advantages and objects thereof, by a consideration of the following detailed description of the preferred embodiment.

Figure 3:
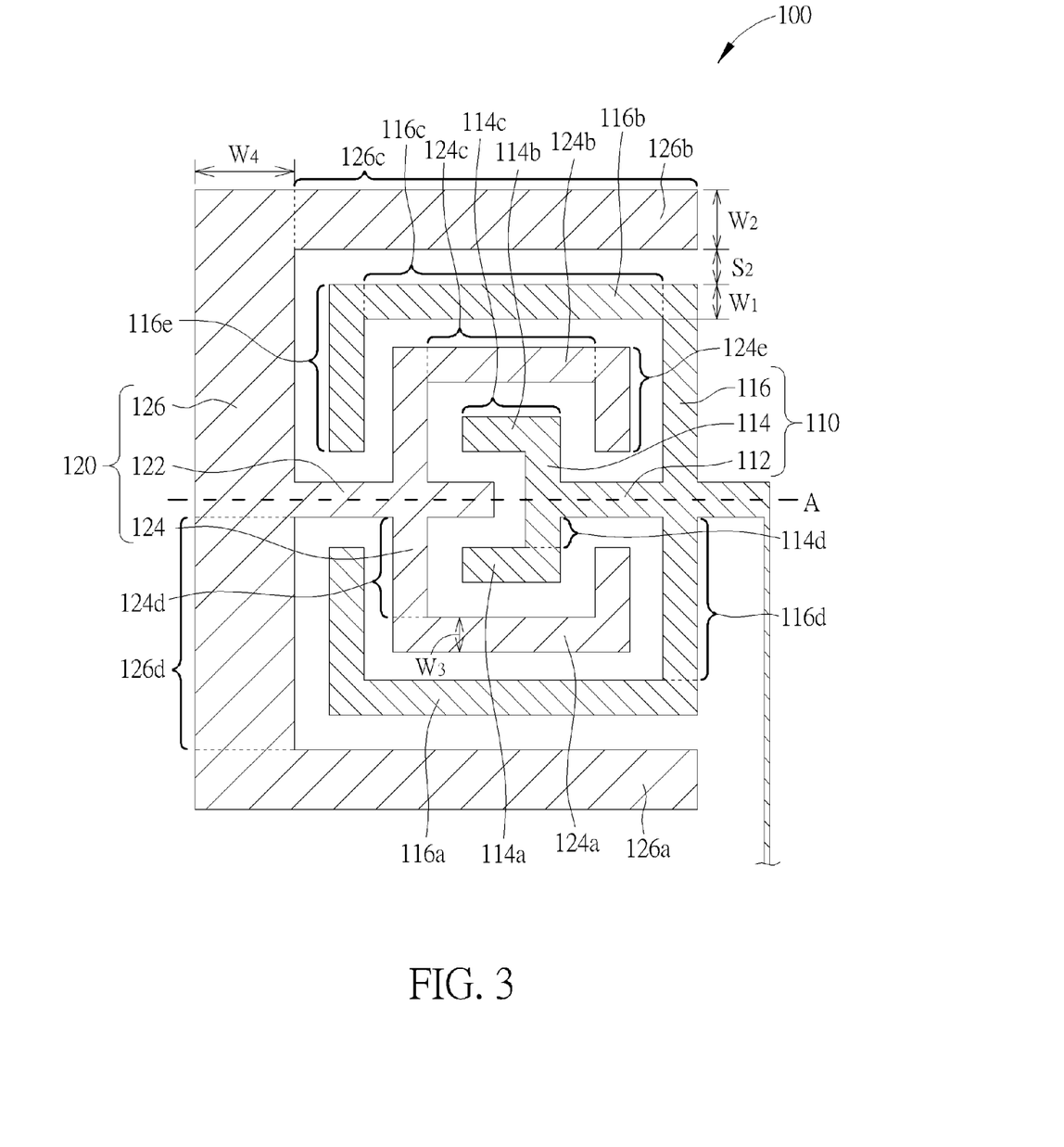
FIG. 3 is a schematic drawing illustrating a touch inductive unit provided by a preferred embodiment of the present invention.

Please refer to FIG. 3, which is a schematic drawing illustrating a touch inductive unit provided by a preferred embodiment of the present invention. As shown in FIG. 3, a touch inductive unit 100 is provided. The touch inductive unit 100 includes a first electrode pattern and a second electrode pattern. According to the preferred embodiment, the first electrode pattern is a receiving electrode pattern 110 and the second electrode patterns is a driving electrode pattern 120, but not limited to this. The receiving electrode pattern 110 includes at least a receiving electrode branch and the driving electrode pattern includes at least a driving electrode branch. More important, the receiving electrode branch and the driving electrode branch are interdigitated and thus a fringe capacitance is generated therebetween. Details about the receiving electrode branch of the receiving electrode pattern 110 and the driving electrode branch of the driving electrode pattern 120 is elucidated hereinafter. As shown in FIG. 3, the receiving electrode pattern 110 includes a first main stem 112, a first branch portion 114, and a second branch portion 116. The first branch portion 114 and the second branch portion 116 are extended from the first main stem 112. And the first branch portion 114 and the second branch portion 116 are exemplarily arranged in pair. Specifically, the first main stem 112 can be taken as a stem of a plant, which extends from one side of the touch inductive unit 100 toward its center. The first branch portion 114 includes a pattern of opposite leave. In detail, the first branch portion 114 includes a first sub-branch 114a and a second sub-branch 114b. The first sub-branch 114a and the second sub-branch 114b are respectively disposed at two opposite sides of the first main stem 112 and thus are axisymmetric about the first main stem 112. In the preferred embodiment, the first branch portion 114 is arranged at a top of the first main stem 112 and therefore a tuning-fork pattern is obtained as shown in FIG. 3, but not limited to this. It is also noteworthy that the first sub-branch 114a and the second sub-branch 114b respectively include a parallel part 114c, which is parallel with the first main stem 112, and a perpendicular part 114d, which is perpendicular to the first main stem 112. Furthermore, the perpendicular part 114d connects the parallel part 114c to the first main stem 112. The second branch portion 116 of the receiving electrode pattern 110 also includes a pattern of opposite leaves. In detail, the second branch portion 116 includes a third sub-branch 116a and a fourth sub-branch 116b. The third sub-branch 116a and the fourth sub-branch 116b are respectively arranged at two opposite sides of the first main stem 112 and thus are axisymmetric about the first main stem 112. Furthermore, the second branch portion 116 is disposed at outside of the first branch portion 114 and surrounding at least apart of the first branch portion 114 as shown in FIG. 3. In other words, the third sub-branch 116a and the fourth sub-branch 116b are arranged at outer sides of the first sub-branch 114a and the second sub-branch 114b. Consequently, the receiving electrode pattern 110 includes a halberd pattern with a tuning-fork type top, but not limited to this. It is also noteworthy that the third sub-branch 116a and the fourth sub-branch 116b respectively include a parallel part 116c, which is parallel with the first main stem 112, and a perpendicular part 116d, which is perpendicular to the first main stem 112. The perpendicular part 116d connects the parallel part 116c to the first main stem 112. In the preferred embodiment, the third sub-branch 116a and the fourth sub-branch 116b can further include another perpendicular part 116e, respectively. As shown in FIG. 3, the perpendicular part 116e and the perpendicular part 116d are disposed at two ends of the parallel part 116c, respectively. It should be easily realized by those skilled in the art that though the receiving electrode branch in the preferred embodiment includes the first branch 114 and the second branch 116, numbers of the receiving electrode branch can be adjusted to fit the needs.

Please refer to FIG. 3 again. The driving electrode pattern 120 of the touch inductive unit 100 includes a second main stem 122, a third branch portion 124, and a fourth branch portion 126. The third branch portion 124 and the fourth branch portion 126 are extended from the second main stem 122. And the third branch portion 124 and the fourth branch portion 126 are exemplarily arranged in pair. Specifically, the second main stem 122 can be taken as a stem of a plant, which extends from one side of the touch inductive unit 100 toward its center. The third branch portion 124 also includes a pattern of opposite leave. In detail, the third branch portion 124 includes a fifth sub-branch 124a and a sixth sub-branch 124b. The fifth sub-branch 124a and the sixth sub-branch 124b are respectively disposed at two opposite sides of the second main stem 122 and thus are axisymmetric about the second main stem 122. Consequently, the second main stem 122 and the third branch portion 124 form a halberd pattern, but not limited to this. It is also noteworthy that the fifth sub-branch 122a and the sixth sub-branch 122b respectively include a parallel part 124c, which is parallel with the second main stem 122, and a perpendicular part 124d, which is perpendicular to the second main stem 122. The perpendicular part 124d connects the parallel part 124c to the second main stem 122. In the preferred embodiment, the fifth sub-branch 124a and the sixth sub-branch 124b can further include another perpendicular part 124e, respectively. The perpendicular part 124e and the perpendicular part 124d are respectively disposed at two ends of the parallel part 124c as shown in FIG. 3. The fourth branch portion 126 of the driving electrode pattern 120 also includes a pattern of opposite leave. In detail, the fourth branch portion 126 includes a seventh sub-branch 126a and an eighth sub-branch 126b. The seventh sub-branch 126a and the eighth sub-branch 126b are respectively disposed at two opposite sides of the second main stem 122 and thus are axisymmetric about the second main stem 122. Furthermore, the fourth branch portion 126 is disposed at outer side of the third branch portion 124 and surrounding at least a part of the third branch portion 124 as shown in FIG. 3. In other words, the seventh sub-branch 126a and the eighth sub-branch 126b are arranged at outer side of the fifth sub-branch 124a and the sixth sub-branch 124b. Consequently, the second main stem 122 and the fourth branch portion 126 also forma halberd pattern, but not limited to this. It is also noteworthy that the seventh sub-branch 126a and the eighth sub-branch 126b respectively include a parallel part 126c, which is parallel with the second main stem 122, and a perpendicular part 126d, which is perpendicular to the second main stem 122. The perpendicular part 126d connects the parallel part 126c to the second main stem 122. It should be easily realized by those skilled in the art that though the driving electrode branch in the preferred embodiment includes the third branch portion 124 and the third branch portion 126, numbers of the driving electrode branch can be adjusted to fit the needs.

Please still refer to FIG. 3. The receiving electrode pattern 110 and the driving electrode pattern 120 of the touch inductive unit 100 provided by the preferred embodiment are constructed by a conductive pattern formed in the same layer and interdigitated as shown in FIG. 3. In detail, a part of the second main stem 122 of the driving electrode pattern 120 extends in between the first sub-branch 114a and the second sub-branch 114b of the first branch portion 114 of the receiving electrode pattern 110, which form the pattern of tuning fork. Extending directions of the first main stem 112 and the second main stem 122 are parallel with each other. The first branch portion 114 of the receiving electrode pattern 110 is disposed in between the second main stem 122 and the third branch portion 124 of the driving electrode pattern 120, therefore the first sub-branch 114a is disposed in between the second main stem 122 and the fifth sub-branch 124a, while the second sub-branch 114b is disposed in between the second main stem 122 and the sixth sub-branch 124b. The third branch portion 124 of the driving electrode pattern 120 is disposed in between the first branch portion 114 and the second branch portion 116 of the receiving electrode pattern 110, therefore the fifth sub-branch 124a is disposed in between the first sub-branch 114a and the third sub-branch 116a while the sixth sub-branch 124b is disposed in between the second sub-branch 114b and the fourth sub-branch 116b. The second branch portion 116 of the receiving electrode pattern 110 is disposed in between the third branch portion 124 and the fourth branch portion 126 of the driving electrode pattern 120, therefore the third sub-branch 116a is disposed in between the fifth sub-branch 124a and the seventh sub-branch 126a while the fourth sub-branch 116b is disposed in between the sixth sub-branch 124b and the eighth sub-branch 126b. Accordingly, the receiving electrode pattern 110 and the driving electrode pattern 120 are axisymmetric about a connecting line A formed of the first main stem 112 and the second main stem 122.

Briefly speaking, any part of the receiving electrode pattern 110 is adjacent to the driving electrode pattern 120, and more particularly, the parallel part 114c/116c of the receiving electrode pattern 110 and the parallel part 124c/126c of the driving electrode pattern 120 are alternately arranged with and therefore adjacent to each other. Accordingly, an arrangement order from periphery to center specified by the preferred embodiment is: the fourth branch portion 126 (of the driving electrode pattern 120), the second branch portion 116 (of the receiving electrode pattern 110), the third branch portion 124 (of the driving electrode pattern 120), the first branch portion 114 (of the receiving electrode pattern 110), and the second main stem 122 (of the driving electrode pattern 120). Additionally, the receiving electrode pattern 110 includes a first width $W_1$ and the driving electrode pattern 120 includes a second width $W_2$. More important, the receiving electrode pattern 110 and the driving electrode pattern 120 are physically and electrically isolated from each other. As shown in FIG. 3, a spacing $S_2$ is formed in between the receiving electrode pattern 110 and the driving electrode pattern 120 for rendering the physical and electrical isolation. By the way, owing to the symmetrically arrangement of the sub-branches, the equivalent resistance of each receiving electrode pattern 110 and each driving electrode pattern 120 can be decreased. For example, in the equivalent electric path of the receiving electrode pattern 110, the resistances of the first sub-branch 114a and second sub-branch 114b are shunt because the sub-branch 114a and 114b are symmetrically arranged about the main stem 112.

Figure 4:
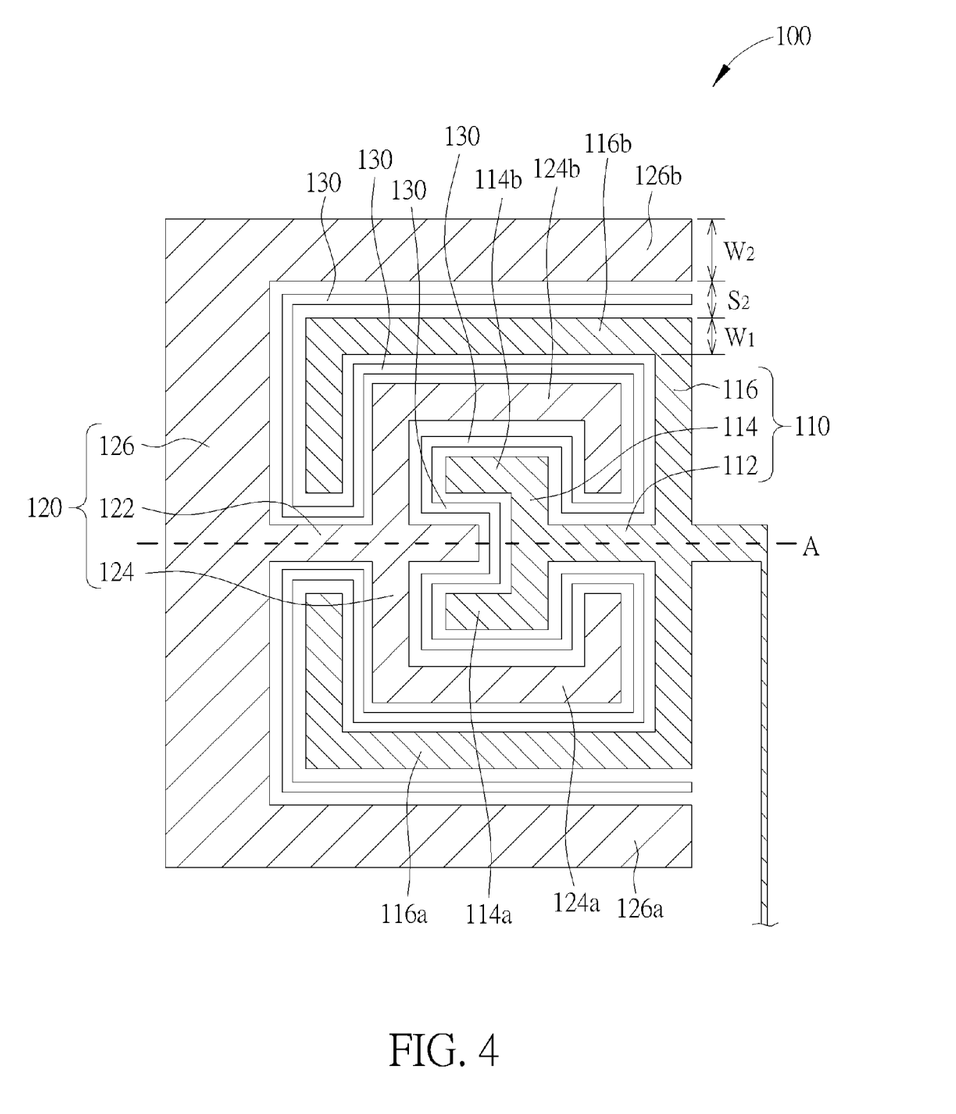
FIG. 4 is a schematic drawing illustrating a modification to the touch inductive unit provided by the present invention.

Please refer to FIG. 4, which is a schematic drawing illustrating a modification to the touch inductive unit provided by the present invention. According to the modification, a plurality of dummy patterns 130 are disposed in the spacing $S_2$ between the receiving electrode pattern 110 and the driving electrode pattern 120. The dummy patterns 130 are floated and thus electrically isolated from the receiving electrode pattern 110 and the driving electrode pattern 120. The dummy patterns 130 are provided in order to prevent the receiving electrode pattern 110 and the driving electrode pattern 120 of the touch inductive unit 100 from being observed and thus adverse optical effect to the users is avoided.

It is well-known to those skilled in the art that the mutual capacitance generated by the receiving electrode pattern 110 and the driving electrode pattern 120 is related to the corresponding length of the receiving electrode pattern 110 and the driving electrode pattern 120. According to the preferred embodiment, the effective length for generating the mutual capacitance is efficaciously increased by providing the receiving electrode pattern 110 including the main stem 112 and the branch portions 114/116 and the driving electrode pattern 120 including the main stem 122 and the branch portions 124/126, which are interdigitated. Consequently, the mutual capacitance in per unit area is increased and thus sensitivity of the touch inductive unit 100 is improved.

Figure 5:
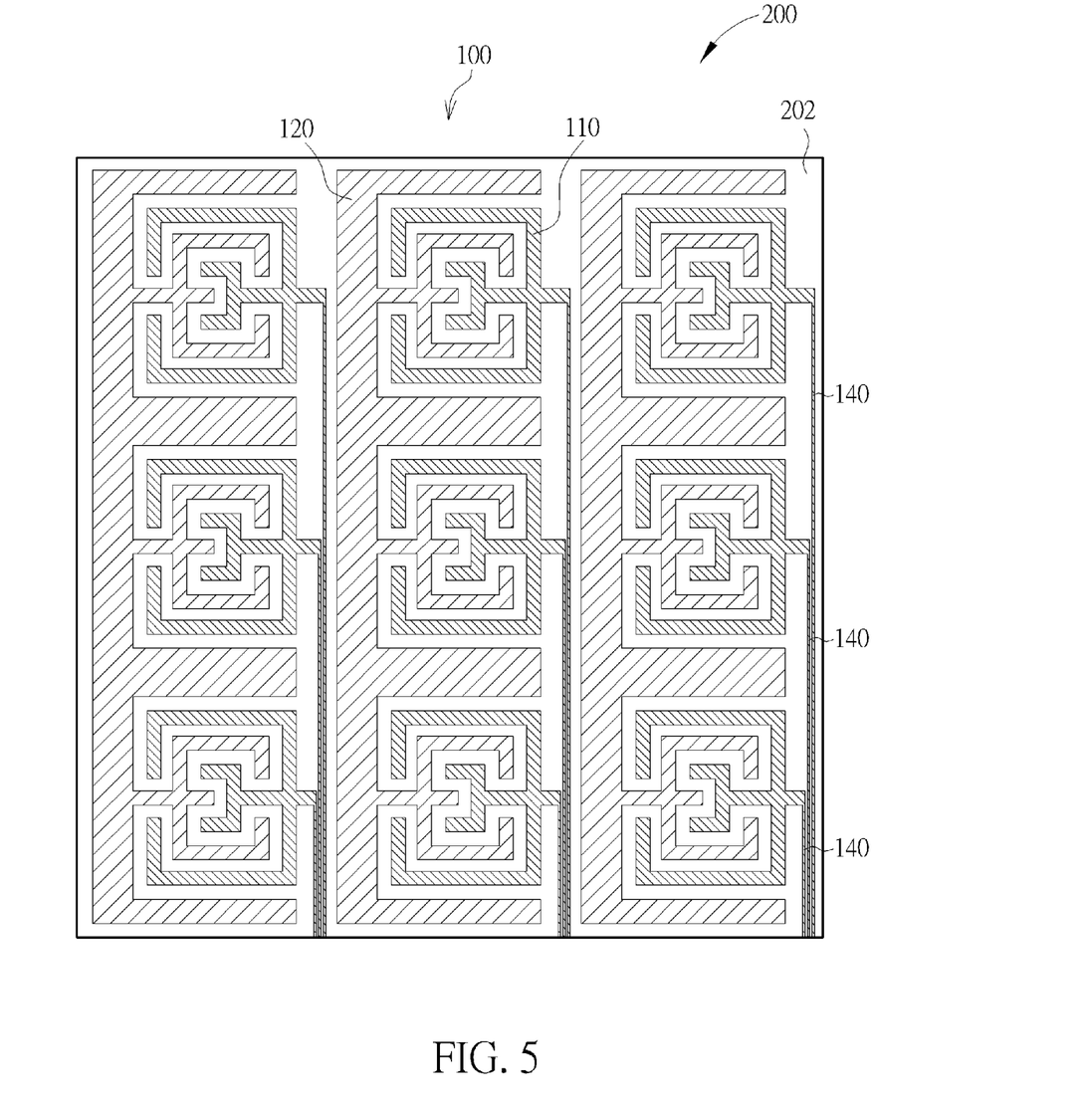
FIG. 5 is a schematic drawing illustrating a touch panel provided by a preferred embodiment of the present invention.

Please refer to FIG. 5, which is a schematic drawing illustrating a touch panel provided by a preferred embodiment of the present invention. It should be noted that the touch inductive unit and the touch panel provided by the preferred embodiment can be integrated into all categories of flat display device, such as a liquid crystal display (LCD) device, a field emission display (FED) device, a plasma display device, an organic light emitting display (OLED) device, or an electrophoretic display (EPD) device, but not limited to this. Additionally, the touch panel provided by the preferred embodiment can be an in cell touch panel or an out cell touch panel. In the out cell touch panel with the touch inductive unit of the present invention, the touch inductive unit can be disposed on a color filter substrate, an array substrate, or an encapsulation of the aforementioned display devices.

Please refer to FIG. 5. The touch panel 200 provided by the preferred embodiment includes at least a substrate 202. The substrate 202 may include a rigid substrate, such as a glass substrate, a cover lens, and a protection glass, a flexible substrate/thin-film substrate, such as a plastic substrate or other substrate composed of suitable materials. Next, a transparent conductive material layer is formed on a surface of the substrate 202. The transparent conductive material layer includes indium tin oxide (ITO), indium zinc oxide (IZO), aluminum zinc oxide (AZO), indium gallium zinc oxide (IGZO), nano-silver yarn or other suitable transparent conductive materials. The transparent conductive material layer is then patterned by a patterning process and a plurality of receiving electrode patterns 110, a plurality of driving electrode patterns 120, and a plurality of conducting lines 140 are formed on the substrate 202. In other words, because the preferred embodiment adopts the one layer solution, the receiving electrode patterns 110, the driving electrode patterns 120 and the conducting lines 140 are all formed by the same transparent conductive material layer and thus are all coplanar. Additionally, the conducting lines 140 can be formed by metal. Furthermore, each of the receiving electrode patterns 110 and the driving electrode patterns 120 can be formed by metal mesh pattern. The metal mesh pattern includes a plurality of metal lines each having the width ranging from 0.08 micrometer to 10 micrometer.

It is noteworthy that the receiving electrode patterns 110 are electrically isolated from each other in the preferred embodiment, and the conducting lines 140 are electrically isolated from each other, too. However each of the receiving electrode patterns 110 is electrically connected to one corresponding conducting line 140. More important, each of the receiving electrode patterns 110 corresponds to one driving electrode pattern 120, and therefore a plurality of touch inductive units 100 formed by the corresponding receiving electrode pattern 110 and the driving electrode pattern 120 pattern 120 are formed on the substrate 202. As shown in FIG. 5, the touch inductive units are arranged in a matrix. Since the touch panel 200 can be integrated into the aforementioned display panel, each of the touch inductive units 100 corresponds to few to dozens of pixel units in the display panel. Each of the touch inductive units 100 includes one receiving electrode pattern 110, one driving electrode pattern 120, and one conductive line 140 that electrically connected to the corresponding receiving electrode pattern 110. It should be noted that the receiving electrode pattern 110 and the driving electrode pattern 120 of each touch inductive unit 100 are interdigitated, but physically and electrically isolated.

Please refer to FIG. 5 again. The receiving electrode pattern 110 of each touch inductive unit 100 includes a configuration as described above. Each receiving electrode pattern 110 includes a first main stem 112, a first branch portion 114, and a second branch portion 116, and the first branch portion 114 and the second branch portion 116 are axisymmetric about the first main stem 112. The second branch portion 116 is disposed at outer side of the first branch portion 114 for surrounding at least a part of the first branch portion 114. At least a part of the first branch portion 114 and at least a part of the second branch portion 116 are perpendicular to the first main stem 112. Since the configuration of the receiving electrode patterns 110 are identical with those described above, those details are omitted in the interest of brevity. And those skilled in the art would easily realize the placement and spatial relationships between sub-branches 114a/114b and 116a/116b according to the aforementioned embodiment.

The driving electrode pattern 120 of each touch inductive unit 100 includes a configuration as described above. Each driving electrode pattern 120 includes a second main stem 122, a third branch portion 124 and a fourth branch portion 126, and the third branch portion 124 and the fourth branch portion 126 are axisymmetric about the second main stem 122. The fourth branch portion 126 is disposed at outer side of the third branch portion 124 for surrounding at least a part of the third branch portion 124. At least a part of the third branch portion 124 and at least a part of the fourth branch portion 126 are perpendicular to the second main stem 122. Since the configuration of the driving electrode patterns 120 are identical with those described above, those details are omitted in the interest of brevity. And those skilled in the art would easily realize the placement and spatial relationships between sub-branches 124a/124b and 126a/126b. It should be noted that the touch inductive units 100 are arranged in the matrix as mentioned above. More important, the driving electrode patterns 120 of the touch inductive units 100 in the same column are electrically connected to each other. In detail, the driving electrode pattern 120 of each touch inductive unit 100 includes the second main stem 122, the third branch portion 124, and the fourth branch portion 126 as mentioned above, and the fourth branch portion 126 is disposed at the outermost side of the touch inductive unit 100. Therefore the fourth branch portions 126 of the driving electrode patterns 120 in the same column are physically and electrically connected to each other. Additionally, a width of the second branch portions 126 of the driving electrode patterns 122 in the same column may by larger than the width of the first branch portions 124 and the second main stems 122 as shown in FIG. 5.

Please still refer to FIG. 5. The receiving electrode pattern 110 of each touch inductive unit 100 includes the first width $W_1$ while the driving electrode pattern 120 of each touch inductive unit 100 includes the second width $W_2$. It is noteworthy that since the fourth branch portions 126 of the driving electrode patterns 120 in the same column include the larger width, only the width of the third branch portions 124 and the second main stems 122 of the driving electrode patterns 120 are provided according to the preferred embodiment. In the preferred embodiment, the first width $W_1$ is between 100 micrometer (μm) and 500 μm, and the second width $W_2$ is between 100 μm and 500 μm. It should be noted that a sum of the first width $W_1$ and the second width $W_2$ are not larger than 600 μm according to the preferred embodiment. Furthermore, the first width $W_1$ is preferably larger than the second width $W_2$ in the preferred embodiment, but not limited to this. Additionally, the driving electrode pattern 120 itself may include different widths. For example, the driving electrode pattern 120 can include a third width $W_3$ and a fourth width $W_4$. The second width $W_2$, the third width $W_3$, and the fourth width $W_4$ can be different from each other as shown in FIG. 3, or be identical to each other if required. As shown in FIG. 5, the receiving electrode pattern 110 and the driving electrode pattern 120 of each touch inductive unit 100 are spaced apart from each other by the spacing $S_2$. In the preferred embodiment, the spacing $S_2$ is, for example but not limited to, 300 μm.

As mentioned above, the mutual capacitance generated from the receiving electrode pattern 110 and the driving electrode pattern 120 is related to the corresponding length of the receiving electrode pattern 110 and the driving electrode pattern 120. According to the preferred embodiment, the effective length for generating the mutual capacitance is efficaciously increased by providing the receiving electrode pattern 110 including the main stem 112 and the branch portions 114/116 and the driving electrode pattern 120 including the main stem 122 and the branch portions 124/126, which are interdigitated. Consequently, the mutual capacitance in per unit area (such as a predetermined area with the dimension of 1 mm*1 mm) is increased and thus sensitivity of the touch inductive unit 100 is improved.

Except the corresponding length of the receiving electrode pattern 110 and the driving electrode pattern 120, the sensitivity the touch inductive unit 100 of the touch panel 200 is also influenced by the first width $W_1$ of the receiving electrode pattern 110, the second width $W_2$ of the driving electrode pattern 120, and the spacing $S_2$. Additionally, it should be understood by those skilled in the art that the sensitivity of the touch inductive unit 100 can be described with the delta C (ΔC, the capacitance difference between touched and untouched operations) and the differential couple ration (hereinafter abbreviated as DCR), which is a quotient of the ΔC over the total capacitance: the higher ΔC and DCR means the more improved sensitivity of the touch inductive unit. According to one preferred embodiment, when the first width $W_1$ is 300 μm, the second width $W_2$ is 300 μm, and the spacing $S_2$ is 300 μm, the ΔC gets 0.27 and DCR reaches 36.38%. In another preferred embodiment when the first width $W_1$ is 400 μm, the second width $W_2$ is 200 μm, and the spacing $S_2$ is 300 μm, the ΔC gets 0.27 and DCR reaches 39.99%. In still another preferred embodiment when the first width $W_1$ is 500 μm, the second width $W_2$ is 100 μm, and the spacing $S_2$ is 300 μm, the ΔC gets 0.26 and DCR reaches 43.72%.

Accordingly, the sensitivity of touch inductive units 100 having the receiving electrode pattern 110 and the driving electrode pattern 120 with special configuration provided by the preferred embodiment is improved. Consequently, the sensitivity of the touch inductive unit 100 is improved without increasing panel loading.

Figure 6:
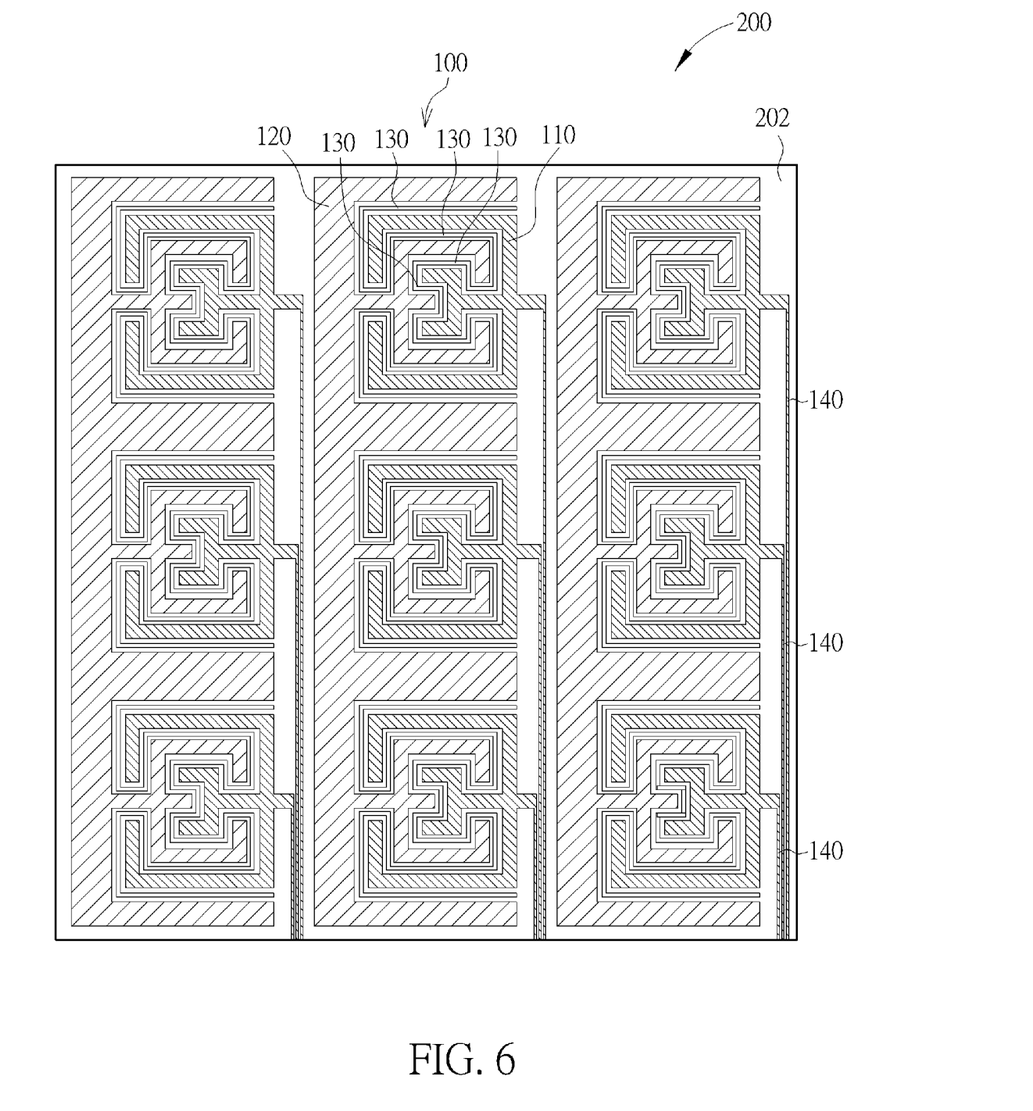
FIG. 6 is a schematic drawing illustrating a modification to the touch panel provided by the present invention.

Please refer to FIG. 6, which is a schematic drawing illustrating a modification to the touch panel provided by the present invention. According to the modification, a plurality of dummy patterns 130 are disposed in the spacing $S_2$ between the receiving electrode pattern 110 and the driving electrode pattern 120. The dummy patterns 130 are provided in order to prevent the receiving electrode pattern 110 and the driving electrode pattern 120 of the touch inductive unit 100 from being observed and thus adverse optical effect to the users is avoided.

Briefly speaking, the touch inductive unit and the touch panel having the same provided by the present invention is realized with one layer solution, therefore the receiving electrode patterns and the driving electrode patterns which construct the touch inductive units on the touch panel are coplanar. Because the receiving electrode pattern and the driving electrode pattern of each touch inductive unit are interdigitated and physically spaced apart from each other, sensitivity of the touch inductive unit is improved without increasing panel loading. Additionally, dummy patterns are disposed in the spacing between the receiving electrode pattern and the driving electrode pattern. The dummy patterns are provided in order to prevent the receiving electrode pattern and the driving electrode pattern having the special configuration from being observed and thus adverse optical effect to the users is avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch inductive unit comprising:
   a receiving electrode pattern comprising a first main stem, a first branch portion, and a second branch portion, the first branch portion and the second branch portion being extended from the first main stem;
   a driving electrode pattern comprising a second main stem, a third branch portion, and a fourth branch portion, the third branch portion and the fourth branch portion being extended from the second main stem,
   the receiving electrode pattern and the receiving electrode pattern are interdigitated and physically spaced apart from each other;
   the second branch portion is disposed at outer side of the first branch portion and surrounding at least a part of the first branch portion;
   the fourth branch portion is disposed at outer side of the third branch portion and surrounding at least a part of the third branch portion;
   at least a part of the first branch portion and at least a part of the second branch portion are perpendicular to the first main stem; and
   at least a part of the third branch portion and at least a part of the fourth branch portion are perpendicular to the second main stem.

2. The touch inductive unit according to claim 1, further comprising a spacing formed in between the receiving electrode pattern and the driving electrode pattern.

3. The touch inductive unit according to claim 2, further comprising a plurality of dummy patterns disposed in the spacing, wherein the dummy patterns, the receiving electrode pattern, and the driving electrode pattern are electrically isolated from each other.

4. The touch inductive unit according to claim 1, wherein the receiving electrode pattern comprises a plurality of parallel parts being parallel with the first main stem, the driving electrode pattern comprises a plurality of parallel parts being parallel with the second main stem, and the parallel parts of the receiving electrode pattern and the parallel parts of the driving electrode pattern are alternately disposed.

5. The touch inductive unit according to claim 1, wherein the first branch portion comprises a first sub-branch and a second sub-branch, the second branch portion comprises a third sub-branch and a fourth sub-branch, the third branch portion comprises a fifth sub-branch and a sixth sub-branch, and the fourth branch portion comprises a seventh sub-branch and an eighth sub-branch.

6. The touch inductive unit according to claim 5, wherein the first sub-branch and the second sub-branch are respectively disposed at two opposite sides of the first main stem, the third sub-branch and the fourth sub-branch are respectively arranged at two opposite sides of the first main stem, the fifth sub-branch and the sixth sub-branch are respectively disposed at two opposite sides of the second main stem, and the seventh sub-branch and the eighth sub-branch are respectively disposed at two opposite sides of the second main stem.

7. The touch inductive unit according to claim 6, wherein the first sub-branch and the second sub-branch are axisymmetric about the first main stem, the third sub-branch and the fourth sub-branch are axisymmetric about the first main stem, the fifth sub-branch and the sixth sub-branch are axisymmetric about the second main stem, and the seventh sub-branch and the eighth sub-branch are axisymmetric about the second main stem.

8. A touch panel comprising:
   a substrate;
   a plurality of receiving electrode patterns disposed on the substrate and electrically isolated from each other, each of the receiving electrode patterns comprising a first main stem, a first branch portion, and a second branch portion, and the first branch portion and the second branch portion being extended from the first main stem;
   a plurality of driving electrode patterns disposed on the substrate and respectively corresponding to one receiving electrode pattern;
   each of the driving electrode patterns comprising a second main stem, a third branch portion, and a fourth branch portion;
   the third branch portion and the fourth branch portion being extended from the second main stem;
   the corresponding receiving electrode pattern and driving electrode pattern are interdigitated and physically spaced apart from each other to form a plurality of touch inductive units on the substrate,
   the second branch portion is disposed at outer side of the first branch portion and surrounding at least a part of the first branch portion;
   at least a part of the first branch portion and at least a part of the second branch portion are perpendicular to the first main stem;
   the fourth branch portion is disposed at outer side of the third branch portion and surrounding at least a part of the third branch portion; and at least a part of the third branch portion and at least a part of the fourth branch portion are perpendicular to the second main stem.

9. The touch panel according to claim 8, wherein the touch inductive units are arranged in a matrix, and the driving electrode patterns of the touch inductive units in the same column are electrically connected.

10. The touch panel according to claim 8, further comprising a spacing in between the corresponding receiving electrode pattern and the driving electrode pattern.

11. The touch panel according to claim 10, further comprising a plurality of dummy patterns disposed in the spacing, wherein the dummy patterns, the receiving electrode pattern, and the driving electrode pattern are electrically isolated from each other.

12. The touch panel according to claim 8, wherein the receiving electrode pattern and the driving electrode pattern are axisymmetric about a connecting line formed of the first main stem and the second main stem.

13. The touch panel according to claim 8, wherein the receiving electrode pattern and the driving electrode pattern are alternately disposed.

14. The touch panel according to claim 8, wherein the first branch portion comprises a first sub-branch and a second sub-branch, the second branch portion comprises a third sub-branch and a fourth sub-branch, the third branch portion comprises a fifth sub-branch and a sixth sub-branch, and the fourth branch portion comprises a seventh sub-branch and an eighth sub-branch.

15. The touch panel according to claim 14, wherein the first sub-branch and the second sub-branch are respectively disposed at two opposite sides of the first main stem, the third sub-branch and the fourth sub-branch are respectively arranged at two opposite sides of the first main stem, the fifth sub-branch and the sixth sub-branch are respectively disposed at two opposite sides of the second main stem, and the seventh sub-branch and the eighth sub-branch are respectively disposed at two opposite sides of the second main stem.

16. The touch panel according to claim 15, wherein the first sub-branch and the second sub-branch are axisymmetric about the first main stem, the third sub-branch and the fourth sub-branch are axisymmetric about the first main stem, the fifth sub-branch and the sixth sub-branch are axisymmetric about the second main stem, and the seventh sub-branch and the eighth sub-branch are axisymmetric about the second main stem.

17. A touch inductive unit comprising:
a receiving electrode pattern comprising at least a receiving electrode branch;
a driving electrode pattern comprising at least a driving electrode branch;
the receiving electrode branch and the driving electrode branch are physically spaced apart from each other to form a fringe capacitance;
the receiving electrode branch comprises a first main stem, a first branch portion and a second branch portion disposed at outer side of the first branch portion and surrounding at least a part of the first branch portion;
the driving electrode branch comprises a second main stem, a third branch portion and a fourth branch portion disposed at outer side of the third branch portion and surrounding at least a part of the third branch portion;
at least a part of the first branch portion and at least a part of the second branch portion are perpendicular to the first main stem; and
at least a part of the third branch portion and at least a part of the fourth branch portion are perpendicular to the second main stem.

18. The touch inductive unit according to claim 17, wherein the receiving electrode branch and the driving electrode branch are interdigitated.

19. The touch inductive unit according to claim 17, wherein the receiving electrode pattern comprises a plurality of parallel parts being parallel with the first main stem, the driving electrode pattern comprises a plurality of parallel parts being parallel with the second main stem, and the parallel parts of the receiving electrode pattern and the parallel parts of the driving electrode pattern are alternately disposed.

20. The touch inductive unit according to claim 17, wherein the first branch portion comprises a first sub-branch and a second sub-branch, the second branch portion comprises a third sub-branch and a fourth sub-branch, the third branch portion comprises a fifth sub-branch and a sixth sub-branch, and the fourth branch portion comprises a seventh sub-branch and an eighth sub-branch.

21. The touch inductive unit according to claim 20, wherein the first sub-branch and the second sub-branch are respectively disposed at two opposite sides of the first main stem, the third sub-branch and the fourth sub-branch are respectively arranged at two opposite sides of the first main stem.

22. The touch inductive unit according to claim 20, wherein the fifth sub-branch and the sixth sub-branch are respectively disposed at two opposite sides of the second main stem, and the seventh sub-branch and the eighth sub-branch are respectively disposed at two opposite sides of the second main stem.

23. The touch inductive unit according to claim 20, wherein the first sub-branch and the second sub-branch are axisymmetric about the first main stem, the third sub-branch and the fourth sub-branch are axisymmetric about the first main stem.

24. The touch inductive unit according to claim 20, wherein the fifth sub-branch and the sixth sub-branch are axisymmetric about the second main stem, and the seventh sub-branch and the eighth sub-branch are axisymmetric about the second main stem.

25. The touch inductive unit according to claim 17, further comprising a plurality of dummy patterns disposed in between the receiving electrode and the driving electrode, wherein the dummy patterns, the receiving electrode pattern, and the driving electrode pattern are electrically isolated from each other.

* * * * *